(12) United States Patent
Ronay

(10) Patent No.: US 7,527,188 B2
(45) Date of Patent: May 5, 2009

(54) SELF-ENCAPSULATED SILVER ALLOYS FOR INTERCONNECTS

(75) Inventor: Maria Ronay, San Francisco, CA (US)

(73) Assignee: International Business Machines Corporation, Armonk, NY (US)

(*) Notice: Subject to any disclaimer, the term of this patent is extended or adjusted under 35 U.S.C. 154(b) by 233 days.

(21) Appl. No.: 11/620,479

(22) Filed: Jan. 5, 2007

(65) Prior Publication Data
US 2007/0161227 A1 Jul. 12, 2007

Related U.S. Application Data

(62) Division of application No. 10/697,014, filed on Oct. 31, 2003, now Pat. No. 7,189,292.

(51) Int. Cl.
B23K 31/02 (2006.01)
H01L 21/31 (2006.01)
H01L 21/76 (2006.01)

(52) U.S. Cl. .................. 228/159; 228/199; 228/262.6; 438/410; 438/626; 438/686; 438/760

(58) Field of Classification Search .................. None
See application file for complete search history.

(56) References Cited

U.S. PATENT DOCUMENTS

| | | | |
|---|---|---|---|
| 2,046,056 A | 6/1936 | Brener | |
| 2,157,933 A | 5/1939 | Hensel et al. | |
| 2,196,307 A | 4/1940 | Hensel et al. | |
| 4,053,728 A * | 10/1977 | Talento et al. | 200/267 |
| 4,775,511 A | 10/1988 | Kono et al. | |
| 5,023,144 A | 6/1991 | Yamamoto et al. | |
| 5,985,684 A * | 11/1999 | Marshall et al. | 438/26 |
| 6,100,194 A * | 8/2000 | Chan et al. | 438/686 |
| 6,181,012 B1 * | 1/2001 | Edelstein et al. | 257/762 |
| 6,412,628 B1 | 7/2002 | Tramposch | |
| 6,693,356 B2 * | 2/2004 | Jiang et al. | 257/767 |
| 7,189,292 B2 * | 3/2007 | Ronay | 148/431 |
| 7,259,095 B2 * | 8/2007 | Ueno | 438/686 |

FOREIGN PATENT DOCUMENTS

| | | |
|---|---|---|
| JP | 01-248538 | 10/1989 |
| JP | 07-176531 | 7/1995 |
| JP | 02-30302 | 1/2002 |

OTHER PUBLICATIONS

"Metals Handbook: Desk Edition", Davis, J.R. ASM International, 1998, pp. 626-627 and 659-660.

* cited by examiner

*Primary Examiner*—Kiley Stoner
(74) *Attorney, Agent, or Firm*—Connolly Bove Lodge & Hutz LLP

(57) ABSTRACT

Alloys of silver and an alloying element that diffuses to the surface of the high conductivity metal and is oxidizable to form an alloying element oxide such as beryllium are provided along with electronic structures employing the alloys and methods of fabrication.

1 Claim, 4 Drawing Sheets

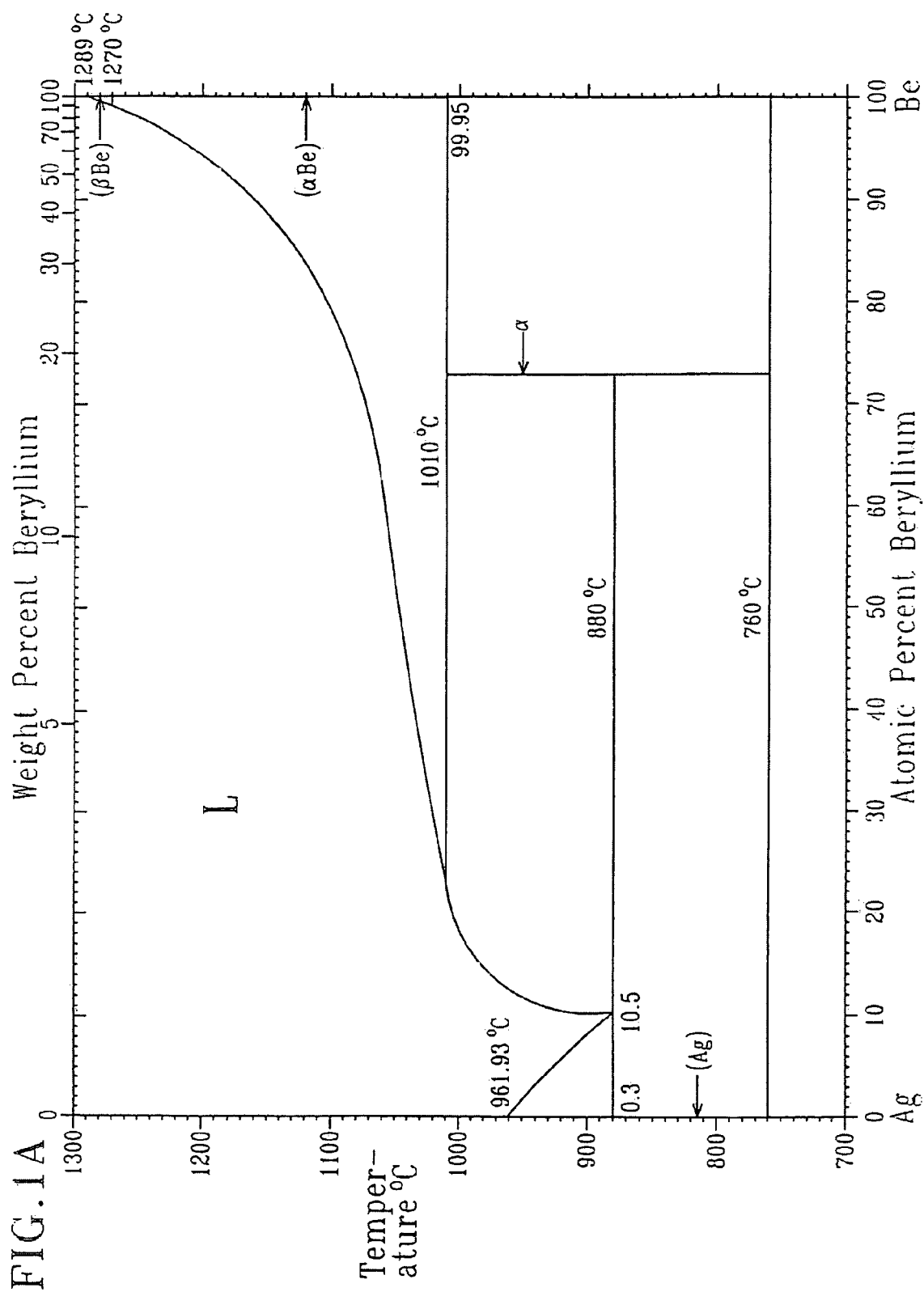

SELF-ENCAPSULATED SILVER ALLOYS FOR INTERCONNECTS

CROSS-REFERENCE TO RELATED APPLICATION

This application is a divisional application of U.S. Ser. No. 10/697,014 filed Oct. 31, 2003 and now U.S. Pat. No. 7,189,292.

TECHNICAL FIELD

The present invention relates to interconnects, that are especially useful for back end of the line (BEOL) metallic conductors in microelectronics devices such as memory and logic devices. A particular embodiment of the present invention relates to a silver-beryllium alloy that is self-encapsulated in beryllium oxide protecting it from the effects of the ambient thereby making it possible to stand alone without a need for barrier layers and capping layers. The present invention enables the use of porous dielectrics and air dielectric (air bridges).

BACKGROUND OF THE INVENTION

With transistor sizes becoming smaller and smaller and switching speeds faster and faster, transmission delay through interconnections between active devices is a major cause of concern. The delay depends on the resistance-capacitance and is referred to as RC delay. The resistance part of the signal delay is due to the resistivity of the metallic interconnect while the capacitance depends on the dielectric constant of the medium applied between the conductor lines. In order to reduce the dielectric constant $SiO_2$ is being replaced by various low-k materials. In an effort to further reduce the dielectric constant these new materials are used in a porous form and since the dielectric constant of air is 1, ultimately some designs have part of the dielectric replaced by air (air bridges). This brings with it the increased need to protect the metal conductor from the ambient.

A few years ago Al—Cu alloy interconnects were replaced by copper interconnects due to the lower restitivity of copper, that is 1.68 micro Ohm-cm versus the 2.65 micro Ohm-cm resistivity of unalloyed aluminum. Copper has however a very great propensity for oxidation and the $Cu_2O$ that forms up to 300° is not a barrier to further oxidation having an open crystal structure.

Consequently copper is protected by barrier layers and capping layers. As the line width of interconnects decreases, the thickness of the layers protecting the copper lines in all directions becomes a significant fraction of the copper line width. Since these protective layers are neither good conductors nor low-k dielectrics, some of the gain in using a lower resistivity conductor and low-k dielectrics is lost.

Also, the National Technology Roadmap for Semiconductors predicts that for the 100 nm device dimension node, a material with a dielectric constant of about 2.0 will be needed to reduce the RC delay associated with BEOL interconnects. The most promising approach to developing such materials is to introduce porosity into a dense dielectric material. One of the problems of integrating these dielectrics into copper or silver based dual damascene schemes is that exposure to ambient conditions even at a relatively low temperature tends to cause oxide and sulphide formation impairing the conductivity of these originally high conductivity metals.

SUMMARY OF INVENTION

The present invention addresses problems of oxidation and/or sulphidation of silver. In particular, according to the present invention the oxidation and/or sulphidation resistance of silver is improved by alloying with certain types of alloying elements.

In particular, the present invention relates to an alloy of silver and an alloying element wherein the alloying element does not form a solid solution with silver or an intermediate phase under 700° C. and diffuses to the surface of the silver at temperatures of 400° C. or below; and is oxidizable to form an alloying element oxide having a conductivity of less than $10^{-5}$ reciprocal Ohm-cm.

Another aspect of the present invention relates to an interconnect structure comprising the above disclosed alloy; and a layer of the alloying element oxide of about 2 to about 10 nanometers thick located on the alloy.

A further aspect of the present invention relates to an electronic structure comprising a dielectric layer having a substantially planar upper surface and having a pattern of recess therein, and the above disclosed alloy being located in recesses.

The present invention also relates to a method for fabricating an interconnect structure which comprises providing an alloy as disclosed above; and selectively oxidizing the alloying element by annealing at temperature of about 250° C. to about 500° C. in an oxidizing atmosphere having an oxidizing agent at a partial pressure of about $10^{-8}$ to about 1 Torr forming a layer of alloying element oxide on the alloy.

A still further aspect of the present invention relates to a process for fabricating an interconnect structure on an electronic device which comprises: forming a patterned resist layer on a substrate having insulating regions and conductive regions, depositing the above disclosed alloy; and removing the patterned resist.

A further aspect of the present invention relates to the process for fabricating an interconnect structure or an electronic device which comprises:

forming an insulating material on a substrate;

lithographically defining and forming recesses for lines and/or vias in the insulating material in which interconnection conductor material will be deposited;

depositing an interconnection conductor material comprising the above disclosed alloy; and planarizing the resulting structure to provide electrical isolation of individual lines and/or vias.

The present invention further relates to a process for fabricating an interconnect structure on an electronic device which comprises:

depositing an insulating material on a substrate, lithographically defining and forming lines and/or vias in which interconnection conductor material will be deposited;

forming a patterned resist layer on the insulating material; depositing a conductor material comprising an alloy as disclosed above;

and removing the patterned resist.

Also, the present invention relates to fabricating an interconnect structure or an electronic device which comprises:

depositing a blanket layer of the above disclosed alloy on a substrate having insulating regions and conductive regions;

forming a patterned resist layer on the blanket layer, removing the conductor material where not covered by the patterned resist and removing the patterned resist.

In addition, according to the present invention, instead of depositing an alloy as disclosed above, structures can be fabricated, for various integration schemes, by depositing in the patterned structure a relatively thin layer of beryllium as a liner barrier followed by depositing silver to the desired thickness. The structure is subjected to an anneal, e.g at temperatue disclosed above. BeO is produced on three sides of the silver but not on the top of the silver in this fabrication technique. In the event, the silver is to be deposited by electroless plating or electroplating instead of PVD, a seed layer of silver is deposited between the beryllium and silver deposit. The seed layer is typically thick enough to form a continuous or substantially continuous layer.

Other objectives and advantages of the present invention will become readily apparent to those skilled in this art from the following detailed description, wherein it is shown and described only the preferred embodiments of the invention simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

SUMMARY OF DRAWINGS

FIGS. 1A and 1B are Ag—Be equilibrium phase diagrams (atomic percent—1A and weight percent—1B).

BEST AND VARIOUS MODES FOR CARRYING OUT INVENTION

Figure 2A:
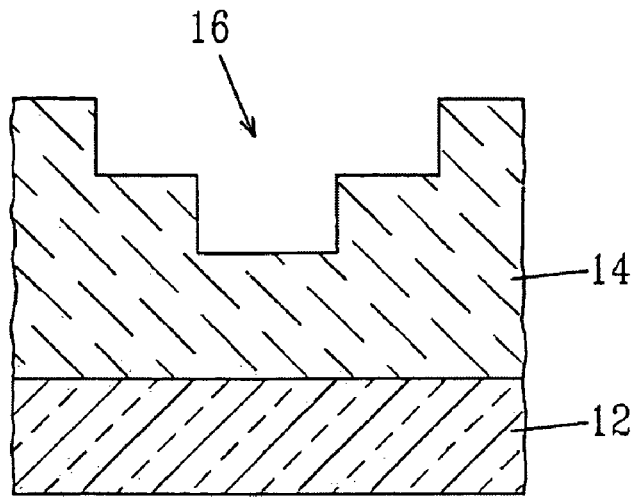
FIGS. 2A-2E illustrate an air-bridge structure incorporating a conductor according to the present invention.

In order to facilitate an understanding of the present invention reference is made to the drawings. FIG. 2A illustrates a structure for fabricating a dual damascene structure. In FIG. 2A, a via 16 is provided in an isolation layer 14 on a semiconductor substrate 12 such as silicon, silicon-germanium alloys, and silicon carbide or gallium arsenide.

Exemplary isolation or dielectric 14 include silicon dioxide (SiO2), phosphosilicate glass (PSG), boron doped PSG (BDPSG) or tetraethylorthosilicate (TEOS). In addition, the dielectric can include low dielectric constant material such as CVD carbon-doped oxide, porous CVD carbon-doped oxide, porous and non-porous spin-on organo silicates, porous and non-porous organic spin-on polymers.

Figure 2B:
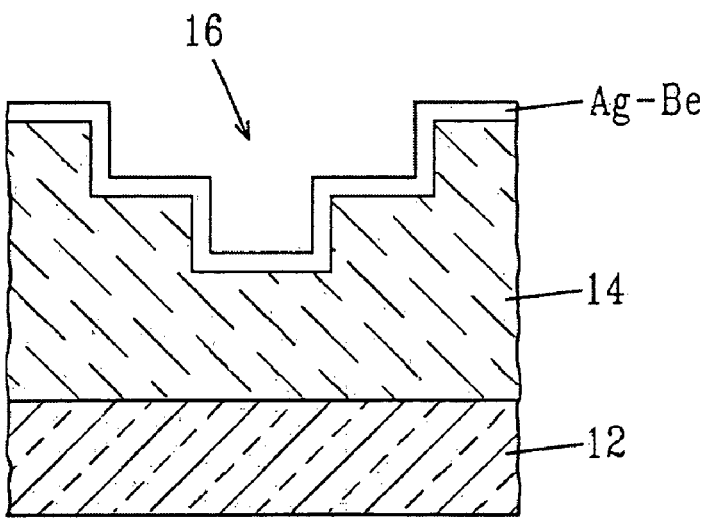

In FIG. 2B, an alloy layer is deposited such as by physical vapor deposition including electron beam evaporation or magnetron sputtering. As an example, the alloy is sputtered from a target defined herein below in an argon atmosphere of about 2 to about 15 milliTorr, more typically about 4 to about 10 mTorr and applying a power of about 50 to about 600 watts, and typically about 200 to about 400 watts.

The alloy includes silver. According to the present invention, the alloying constituent employed does not form a solid solution with silver or an intermediate phase with the temperatures below 700° C. and thus does not impair to an undesired extent the conductivity of the metal. The alloying element is segregated to the surface of the metal by diffusion at temperatures of 400° C. or below and is selectively oxidized. The metal does not oxidize because the metal is encapsulated in the oxide of the alloying element. This oxide has a high resistivity and therefore it does not permit electron transport that is necessary for oxide growth. Consequently, a self-limiting oxide will be created that is relatively thin, typically in the order of about 2 to about 10 nanometers. The oxide typically has a relatively low dielectric constant so as not to cause significant capacitance increase and also typically has excellent heat conductivity.

The preferred alloying element is beryllium. Other alloying elements are Al and Si. Typical alloys according to the present invention are silver-beryllium alloys typically containing about 0.2% by weight to about 5% by weight of beryllium, more typically containing about 0.2% by weight to about 3% by weight of beryllium and even more typically about 0.2% by weight to about 2% by weight of beryllium.

Figure 1B:
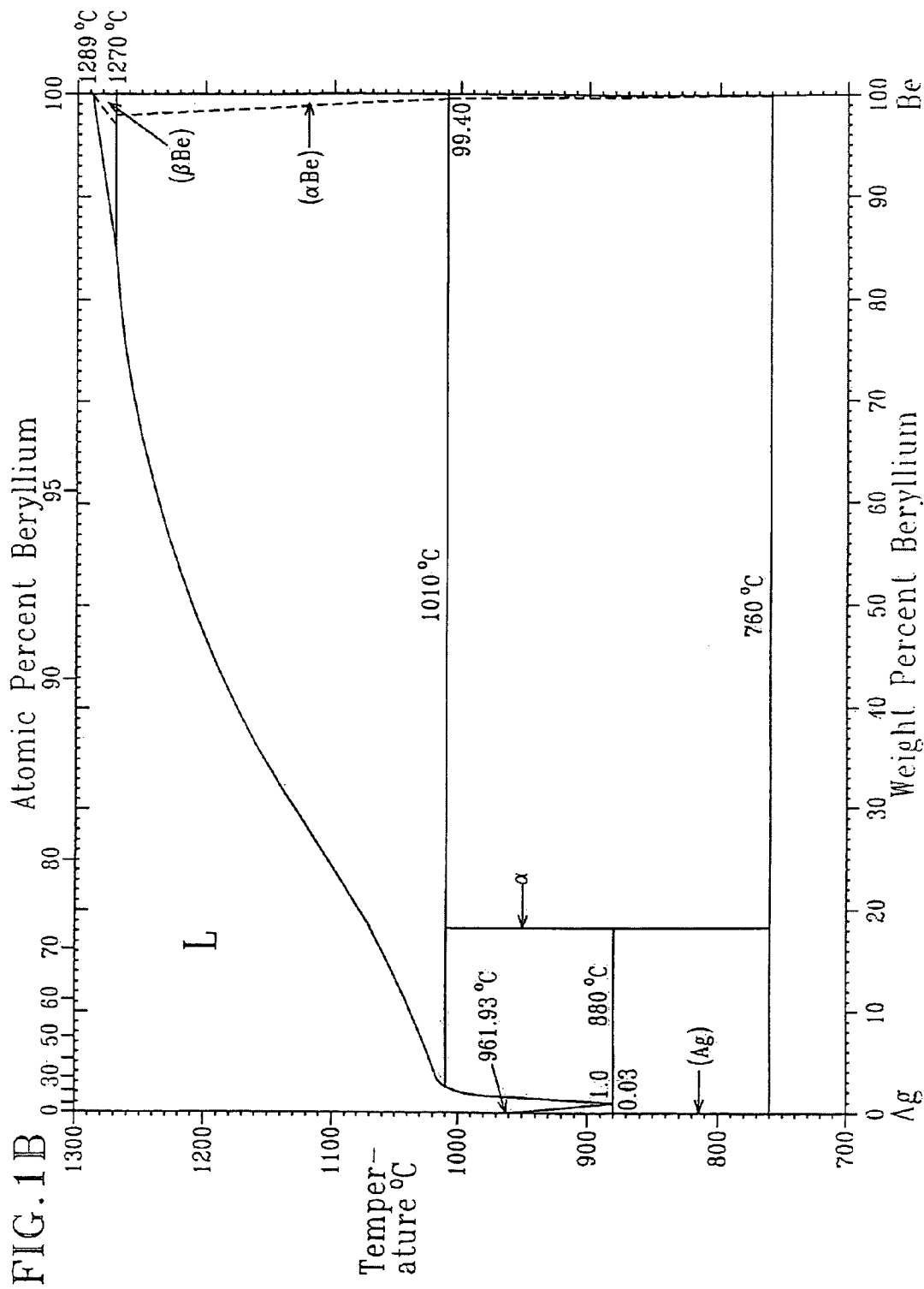

FIGS. 1A and 1B give the silver beryllium equilibrium phase diagram showing the absence of mutual solid solubility of silver and beryllium as well as intermediate phase formation under 760° C. The figures show the phase diagram both for atomic percent (1A) and for weight percent(1B). Due to the large difference between the density of beryllium (a light metal) and silver (a heavy metal) small weight percentages of beryllium represent large atomic percents.

The alloy is for example sputtered from a Ag—Be target, or may be co-sputtered from separate silver and beryllium targets. On top of the alloy layer a thin silver layer may be deposited to protect the alloy from exposure to an electrolyte.

Figure 2C:
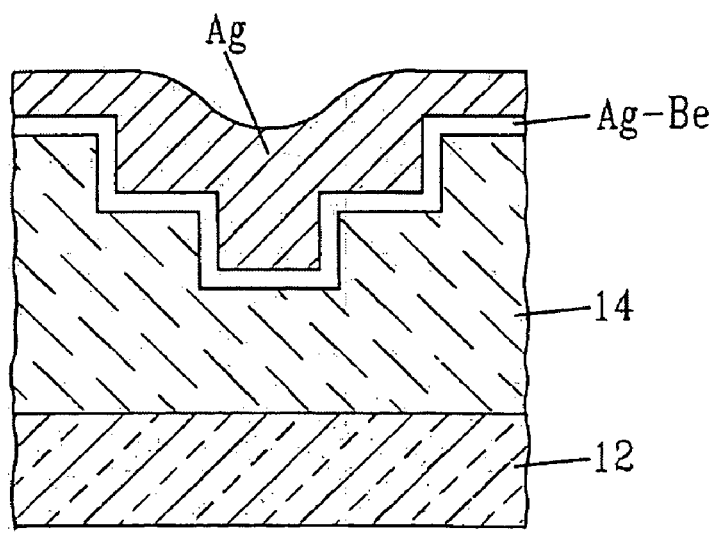

The silver-beryllium layer acts as a seed layer for subsequent plating of silver. The silver can be electroplated or electroless plated to fill the vias. Silver is normally electroplated using potassium cyanide solutions, which exhibit the highest plating current densities. Electroless silver is plated from a two-solution silvering system of NaOH and ammoniacal Ag $NO_3$ mixed with a glucose solution containing an amine group. See FIG. 2C.

Figure 2D:
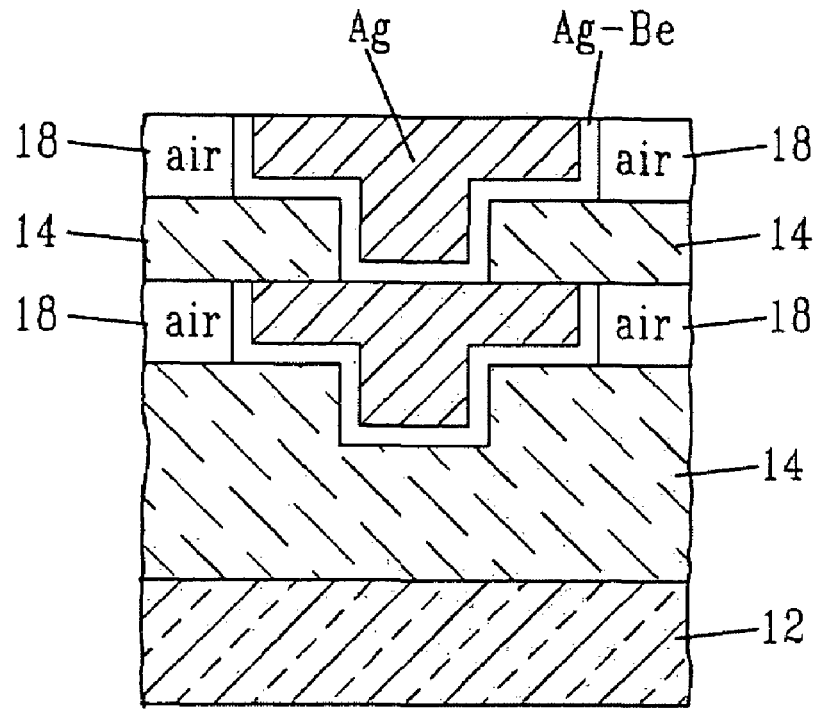

The filled structure can then be planarized such as by chemical mechanical planarzation or electropolishing. This process can be repeated for several levels. Some of the low-k dielectric is removed by etching back to create air bridges 18 as illustrated in FIG. 2D.

Figure 2E:
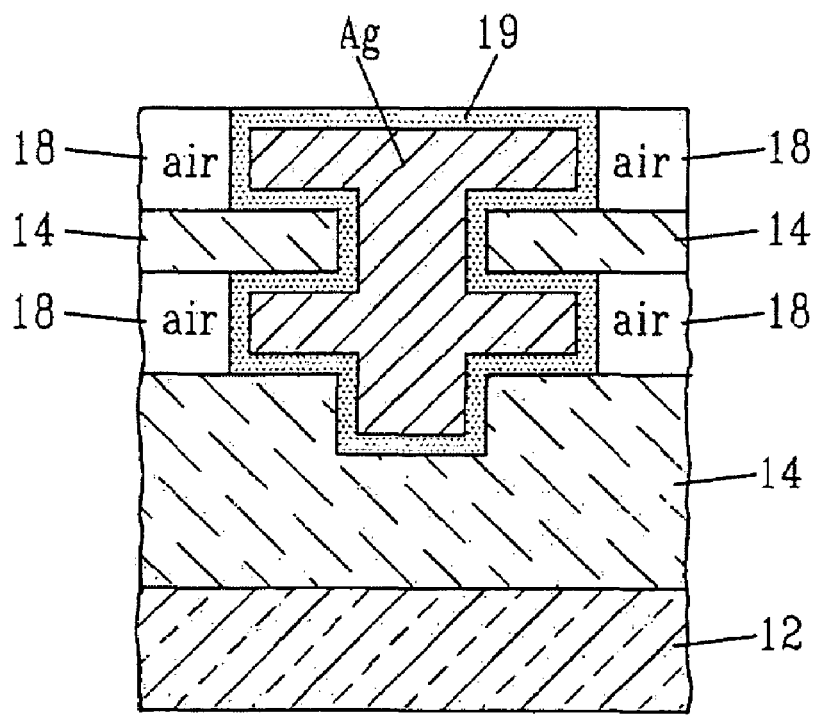

Selective oxidation of the beryllium can be carried out at temperature of about 250 to about 500° C. and in an atmosphere of low partial pressure of an oxidizing agent such oxygen or water vapor such as about $10^{-8}$ to about 1 Torr. The time of the heat treatment is typically about 10 to about 30 minutes depending on temperature. During the heat treatment, the beryllium diffuses to the surface of the silver forming a thin and compact film on the surface. The exposure to the oxygen containing gas produces a BeO film 19 on the surface, which drives the further diffusion of beryllium to the surface and protects the underlying silver against oxygen or sulphur containing gases. Thermodynamic considerations favor the formation of BeO instead of $Ag_2O$ since the heats of formation are 286 and 14 kcal/mole oxygen, respectively. See FIG. 2E. It is important to note that BeO forms only at the surface of silver at interfaces with dielectric materials but not at the interface with a metallic via. It is also important to note, that $Ag_2O$ decomposes to silver and oxygen at temperatures of about 190° Centrigrade.

Other fabrication techniques in addition to creating damascene structure can, of course, be employed pursuant to the present invention. Such techniques include fabricating conductor elements.

The process for through-mask plating on a planar base includes providing an insulating layer on a substrate followed by a patterned resist layer. The alloy of the present invention is plated through the patterned resist. The resist is then removed.

The process for through-mask plating on an excavated base comprises forming a via or channel in an insulating layer on a substrate. A patterned resist is formed over the insulating layer. The alloy of the present invention is plated through the mask or resist into the vias. The mask or resist is then removed.

The process for blanket plating comprises blanket plating an alloy of the present invention over an insulating layer on substrate. A layer of resist is formed over the blanket layer and lithographically patterned. The blanket layer is then patterned by etching or removing by other processes where not protected by resist. The resist is then removed.

The following non-limiting examples are presented to further illustrate the present invention.

EXAMPLE 1

The trenches of a patterned low-k dielectric BEOL structure are filled by physical vapor deposition with 0.2% by weight Be—Ag alloy and planarized with CMP. This process is repeated for several levels. Some of the low-k dielectrics may be etched back to create air bridges. After each level is completed or after a plurality of or all levels are completed, an annealing takes place at 250° C. for 20 minutes in $6\times10^{-8}$ Torr partial pressure of oxygen. During this treatment the beryllium diffuses to the surface of the multilevel conductor and oxidizes to BeO, which encapsulates the silver metal.

EXAMPLE 2

The trenches of a patterned low-k dielectric BEOL structure are filled by chemical vapor deposition with a 0.3% by weight Be—Ag alloy, and the process continues as in Example 1.

EXAMPLE 3

The trenches of a patterned porous low-k dielectric BEOL structure are lined with a 3% by weight Be—Ag alloy by physical vapor deposition. Subsequently the trenches are filled with pure silver deposited also by physical vapor deposition and planarized with CMP. The process is continued as in Example 1.

EXAMPLE 4

The trenches of a patterned low-k dielectric BEOL structure are lined with a 2.0% by weight Be—Ag alloy by physical vapor deposition, which serves as a seed layer for the subsequent electroplating. Pure silver is then electroplated from a known cyanide silver plating bath at the relevant current densities. The filled structure is planarized with CMP and the processes repeated on several levels. After each level is completed or after more than one level is completed, an annealing takes place at 350° Centigrade for 10 minutes at $1\times10^{-8}$ Torr partial pressure of oxygen. During this treatment the beryllium diffuses from the liner to the surfaces of the conductor and oxidizes to BeO which encapsulates the silver metal. This example is depicted in FIG. 2.

EXAMPLE 5

Example 4 is repeated except that silver is deposited on the liner/seed layer with electroless plating. The electroless plating bath is an $AgNO_3$ based bath.

EXAMPLE 6

Example 5 is repeated, except that over the Ag—Be liner a thin layer of pure silver is deposited also by physical vapor deposition to protect the beryllium from the electrolyte.

EXAMPLE 7

The trenches of the dielectric are lined with about 0.5 to about 3 nanometers of pure beryllium deposited by atomic layer deposition or other suitable means followed by the deposition of a silver seed layer followed by filling the trenches by the electroplating or electroless plating of silver. Afterwards the structure is annealed at temperatures of about 250° C. to about 500° C. The annealing allows for the formation of a thin BeO barrier layer by gettering oxygen from the dielectric. BeO is formed on three sides of the silver but not on the top of the silver. In the following CMP, the BeO may be left remaining between the conductor lines since it is an insulator with a dielectric constant of 6.

All publications and patent applications cited in this specification are herein incorporated by reference, and for any and all purposes, as if each individual publication or patent application were specifically and individually indicated to be incorporated by reference.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the invention concept as expressed herein, commensurate with the above teachings and/or skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process for fabricating an interconnect structure on an electronic device which comprises:
    forming an insulating material on a substrate, wherein said insulating material comprises at least one member selected from the group consisting of silicon dioxide, phosphosilicate glass, boron doped PSG, tetraethylorthosilicate and a low-k dielectric material and said low-k dielectric material comprises at least one member selected from the group consisting of CVD porous carbon-doped oxide, non-porous carbon-doped oxide, porous spin-on organo silicates, non-porous spin-on organo silicates, porous spin-on organic polymers and non-porous spin-on organic polymers;
    lithographically defining and forming recesses for lines and/or via in said insulating material in which interconnection conductor material will be deposited;
    depositing an interconnection conductor material comprising an alloy of silver and beryllium, wherein the amount of beryllium is about 0.2 to about 5% by weight; wherein the beryllium is deposited in recesses and the silver is deposited above the beryllium; and providing a silver seed layer between said beryllium and silver;
    selectively oxidizing the beryllium by annealing at temperatures of about 250° C. to about 500° C. in an oxidizing atmosphere containing an oxidizing agent having a partial pressure of about $10^{-8}$ to about 1 Torr wherein the oxidizing agent comprises oxygen or water vapor thereby forming a layer of beryllium oxide on the alloy; and
    planarizing the resulting structure to provide electrical isolation of individual lines and/or vias.

\* \* \* \* \*